US011121770B2

(12) United States Patent
Joseph et al.

(10) Patent No.: US 11,121,770 B2
(45) Date of Patent: Sep. 14, 2021

(54) OPTICAL LASER DEVICE

(71) Applicant: Lumentum Operations LLC, San Jose, CA (US)

(72) Inventors: John R. Joseph, Albuquerque, NM (US); Kevin L. Lear, Fort Collins, CO (US); David Abell, Albuquerque, NM (US)

(73) Assignee: Lumentum Operations LLC, San Jose, CA (US)

( * ) Notice: Subject to any disclaimer, the term of this patent is extended or adjusted under 35 U.S.C. 154(b) by 0 days.

(21) Appl. No.: 16/840,063

(22) Filed: Apr. 3, 2020

(65) Prior Publication Data

US 2020/0235811 A1 Jul. 23, 2020

Related U.S. Application Data

(60) Continuation of application No. 14/946,730, filed on Nov. 19, 2015, now Pat. No. 10,615,871, which is a
(Continued)

(51) Int. Cl.
*H04B 10/11* (2013.01)
*G02B 5/02* (2006.01)
(Continued)

(52) U.S. Cl.
CPC ............... *H04B 10/11* (2013.01); *G02B 5/02* (2013.01); *G02B 5/32* (2013.01); *G02B 27/0905* (2013.01);
(Continued)

(58) Field of Classification Search
CPC .. H04B 10/11; H04B 10/1121; H04B 10/801; G02B 5/02; G02B 27/10; G06E 3/006
See application file for complete search history.

(56) References Cited

U.S. PATENT DOCUMENTS 3,805,255 A   4/1974 Baker
4,119,948 A   10/1978 Ward et al.
(Continued)

FOREIGN PATENT DOCUMENTS

CN   1449130 A   10/2003
CN   200976052 Y   11/2007
(Continued)

OTHER PUBLICATIONS

Warren et al, "Integration of Diffractive Lenses with Addressable Vertical-Cavity Laser Arrays", Sandia National Laboratories, Albuquerque, NM 87185, Conf-950226-38, Sand95-0360C.
(Continued)

*Primary Examiner* — David W Lambert
(74) *Attorney, Agent, or Firm* — Harrity & Harrity, LLP

(57) ABSTRACT

High power, high speed VCSEL arrays are employed in unique configurations of arrays and sub-arrays. Placement of a VCSEL array behind a lens allows spatial separation and directivity. Diffusion may be employed to increase alignment tolerance. Intensity modulation may be performed by operating groups of VCSEL emitters at maximum bias. Optical communications networks with high bandwidth may employ angular, spatial, and/or wavelength multiplexing. A variety of network topologies and bandwidths suitable for the data center may be implemented. Eye safe networks may employ VCSEL emitters may be paired with optical elements to reduce optical power density to eye safe levels.

20 Claims, 8 Drawing Sheets

Related U.S. Application Data division of application No. 13/594,714, filed on Aug. 24, 2012, now abandoned, and a continuation-in-part of application No. 13/077,769, filed on Mar. 31, 2011, now Pat. No. 8,848,757, which is a continuation of application No. 12/707,657, filed on Feb. 17, 2010, now Pat. No. 7,949,024, said application No. 14/946,730 is a continuation-in-part of application No. 12/970,880, filed on Dec. 16, 2010, now Pat. No. 8,613,536.

(60) Provisional application No. 61/671,036, filed on Jul. 12, 2012, provisional application No. 61/528,119, filed on Aug. 26, 2011, provisional application No. 61/153,190, filed on Feb. 17, 2009, provisional application No. 61/288,269, filed on Dec. 19, 2009.

(51) Int. Cl.

| | |
|---|---|
| G02B 27/10 | (2006.01) |
| H01S 5/00 | (2006.01) |
| H01S 5/42 | (2006.01) |
| H01S 5/02325 | (2021.01) |
| G02B 5/32 | (2006.01) |
| G02B 27/09 | (2006.01) |
| H04B 10/50 | (2013.01) |
| H01S 5/062 | (2006.01) |
| H01S 5/50 | (2006.01) |
| H01S 5/02345 | (2021.01) |

(52) U.S. Cl.
CPC ......... *G02B 27/0944* (2013.01); *G02B 27/10* (2013.01); *H01S 5/005* (2013.01); *H01S 5/02325* (2021.01); *H01S 5/423* (2013.01); *H04B 10/503* (2013.01); *H01S 5/02345* (2021.01); *H01S 5/06226* (2013.01); *H01S 5/50* (2013.01)

(56) References Cited

U.S. PATENT DOCUMENTS

| | | |
|---|---|---|
| 4,127,322 A | 11/1978 | Jacobson et al. |
| 4,447,136 A * | 5/1984 | Kitamura ............ G02B 6/4204 359/641 |
| 4,448,491 A | 5/1984 | Okubo |
| 4,714,314 A | 12/1987 | Yang et al. |
| 4,822,755 A | 4/1989 | Hawkins et al. |
| 4,827,482 A | 5/1989 | Towe et al. |
| 4,850,685 A | 7/1989 | Kamakura et al. |
| 4,870,652 A | 9/1989 | Thornton |
| 4,881,237 A | 11/1989 | Donnelly |
| 4,971,927 A | 11/1990 | Leas |
| 5,034,344 A | 7/1991 | Jewell et al. |
| 5,060,304 A | 10/1991 | Solinsky |
| 5,070,399 A | 12/1991 | Martel |
| 5,073,041 A | 12/1991 | Rastani |
| 5,098,183 A | 3/1992 | Sonehara |
| 5,164,949 A | 11/1992 | Ackley et al. |
| 5,258,316 A | 11/1993 | Ackley et al. |
| 5,317,170 A * | 5/1994 | Paoli ........................ B41J 2/45 257/88 |
| 5,325,385 A | 6/1994 | Kasukawa et al. |
| 5,325,386 A | 6/1994 | Jewell et al. |
| 5,328,854 A | 7/1994 | Vakhshoori et al. |
| 5,359,618 A | 10/1994 | Lebby et al. |
| 5,383,200 A | 1/1995 | Barrett et al. |
| 5,402,436 A | 3/1995 | Paoli |
| 5,420,879 A | 5/1995 | Kawarada et al. |
| 5,422,753 A | 6/1995 | Harris |
| 5,422,903 A | 6/1995 | Yamada et al. |
| 5,457,561 A | 10/1995 | Taneya et al. |
| 5,504,767 A | 4/1996 | Jamison et al. |
| 5,557,115 A | 9/1996 | Shakuda |
| 5,574,738 A | 11/1996 | Morgan |
| 5,581,571 A | 12/1996 | Holonyak, Jr. et al. |
| 5,640,188 A | 6/1997 | Andrews |
| 5,680,241 A * | 10/1997 | Sakanaka ............ H04B 10/1121 356/432 |
| 5,707,139 A | 1/1998 | Haitz |
| 5,745,515 A | 4/1998 | Mart et al. |
| 5,758,951 A | 6/1998 | Haitz |
| 5,781,671 A | 7/1998 | Li et al. |
| 5,801,666 A | 9/1998 | MacFarlane |
| 5,812,571 A | 9/1998 | Peters et al. |
| 5,825,803 A | 10/1998 | Labranche et al. |
| 5,896,408 A | 4/1999 | Corzine et al. |
| 5,918,108 A | 6/1999 | Peters |
| 5,930,279 A | 7/1999 | Apollonov et al. |
| 5,976,905 A | 11/1999 | Cockerill et al. |
| 5,991,318 A | 11/1999 | Caprara et al. |
| 6,007,218 A | 12/1999 | German et al. |
| 6,044,101 A | 3/2000 | Luft |
| 6,075,650 A | 6/2000 | Morris et al. |
| 6,075,804 A | 6/2000 | Deppe et al. |
| 6,125,598 A | 10/2000 | Lanphier |
| 6,128,131 A | 10/2000 | Tang |
| 6,136,623 A | 10/2000 | Hofstetter et al. |
| 6,154,480 A | 11/2000 | Magnusson et al. |
| 6,167,068 A | 12/2000 | Caprara et al. |
| 6,215,598 B1 | 4/2001 | Hwu |
| 6,259,715 B1 | 7/2001 | Nakayama |
| 6,353,502 B1 | 3/2002 | Marchant et al. |
| 6,393,038 B1 | 5/2002 | Raymond et al. |
| 6,446,708 B1 | 9/2002 | Lai |
| 6,493,368 B1 | 12/2002 | Chirovsky et al. |
| 6,608,849 B2 | 8/2003 | Mawst et al. |
| 6,650,451 B1 | 11/2003 | Byers et al. |
| 6,661,820 B1 | 12/2003 | Camilleri et al. |
| 6,728,289 B1 | 4/2004 | Peak et al. |
| 6,757,314 B2 | 6/2004 | Kneissl et al. |
| 6,775,308 B2 | 8/2004 | Hamster et al. |
| 6,775,480 B1 | 8/2004 | Goodwill |
| 6,898,222 B2 | 5/2005 | Hennig et al. |
| 6,922,430 B2 | 7/2005 | Biswas et al. |
| 6,943,875 B2 | 9/2005 | DeFelice et al. |
| 6,947,459 B2 | 9/2005 | Kurtz et al. |
| 6,959,025 B2 | 10/2005 | Jikutani et al. |
| 6,974,373 B2 | 12/2005 | Kriesel |
| 7,016,381 B2 | 3/2006 | Husain et al. |
| 7,087,886 B2 | 8/2006 | Almi et al. |
| 7,126,974 B1 | 10/2006 | Dong et al. |
| 7,232,240 B2 | 6/2007 | Kosnik et al. |
| 7,257,141 B2 | 8/2007 | Chua |
| 7,262,758 B2 | 8/2007 | Kahen et al. |
| 7,315,560 B2 | 1/2008 | Lewis et al. |
| 7,357,513 B2 | 4/2008 | Watson et al. |
| 7,359,420 B2 | 4/2008 | Shchegrov et al. |
| 7,385,229 B2 | 6/2008 | Venugopalan |
| 7,386,025 B2 | 6/2008 | Omori et al. |
| 7,388,893 B2 | 6/2008 | Watanabe et al. |
| 7,430,231 B2 | 9/2008 | Luo et al. |
| 7,471,854 B2 | 12/2008 | Cho et al. |
| 7,568,802 B2 | 8/2009 | Phinney et al. |
| 7,613,215 B2 | 11/2009 | Kim |
| 7,680,168 B2 | 3/2010 | Uchida |
| 7,688,525 B2 * | 3/2010 | Hines ...................... G02B 3/08 359/726 |
| 7,742,640 B1 | 6/2010 | Carlson et al. |
| 7,751,716 B2 | 7/2010 | Killinger |
| 7,787,767 B2 | 8/2010 | Wang |
| 7,796,081 B2 | 9/2010 | Breed |
| 7,834,302 B2 | 11/2010 | Ripingill et al. |
| 7,911,412 B2 | 3/2011 | Benner |
| 7,925,059 B2 | 4/2011 | Hoyos et al. |
| 7,949,024 B2 | 5/2011 | Joseph |
| 7,970,279 B2 | 6/2011 | Dress |
| 8,995,485 B2 | 3/2015 | Joseph et al. |
| 8,995,493 B2 | 3/2015 | Joseph et al. |
| 9,746,369 B2 | 8/2017 | Shpunt et al. |
| 10,615,871 B2 | 4/2020 | Joseph et al. |
| 2001/0038596 A1 | 11/2001 | Xu et al. |

(56) References Cited

U.S. PATENT DOCUMENTS

| | | |
|---|---|---|
| 2001/0040714 A1 | 11/2001 | Sundaram et al. |
| 2001/0043381 A1 | 11/2001 | Green et al. |
| 2002/0034014 A1 | 3/2002 | Gretton et al. |
| 2002/0041562 A1 | 4/2002 | Redmond et al. |
| 2002/0129723 A1 | 9/2002 | Beier et al. |
| 2002/0141011 A1 | 10/2002 | Green et al. |
| 2002/0141902 A1 | 10/2002 | Ozasa et al. |
| 2003/0035451 A1 | 2/2003 | Ishida et al. |
| 2003/0091084 A1 | 5/2003 | Sun et al. |
| 2003/0095800 A1 | 5/2003 | Finizio et al. |
| 2003/0215194 A1 | 11/2003 | Kuhmann et al. |
| 2004/0101312 A1 | 5/2004 | Cabrera |
| 2004/0120717 A1 | 6/2004 | Clark et al. |
| 2004/0207926 A1 | 10/2004 | Buckman et al. |
| 2004/0208596 A1 | 10/2004 | Bringans et al. |
| 2005/0019973 A1 | 1/2005 | Chua |
| 2005/0025210 A1 | 2/2005 | Aoyagi et al. |
| 2005/0025211 A1 | 2/2005 | Zhang et al. |
| 2005/0122720 A1 | 6/2005 | Shimonaka et al. |
| 2005/0129407 A1 | 6/2005 | Coleman |
| 2005/0147135 A1 | 7/2005 | Kurtz et al. |
| 2006/0067707 A1* | 3/2006 | Maniam ............ H04B 10/116 398/183 |
| 2006/0109883 A1 | 5/2006 | Lewis et al. |
| 2006/0268241 A1 | 11/2006 | Watson et al. |
| 2006/0274918 A1 | 12/2006 | Amantea et al. |
| 2006/0280219 A1 | 12/2006 | Shchegrov |
| 2007/0030570 A1 | 2/2007 | Jacobowitz et al. |
| 2007/0052660 A1 | 3/2007 | Montbach et al. |
| 2007/0099395 A1 | 5/2007 | Sridhar et al. |
| 2007/0153862 A1 | 7/2007 | Shchegrov et al. |
| 2007/0153866 A1 | 7/2007 | Shchegrov et al. |
| 2007/0242958 A1 | 10/2007 | Ieda |
| 2007/0273957 A1 | 11/2007 | Zalevsky et al. |
| 2008/0008471 A1* | 1/2008 | Dress ............... H01J 17/34 398/66 |
| 2008/0205462 A1 | 8/2008 | Uchida |
| 2008/0273830 A1 | 11/2008 | Chen et al. |
| 2008/0317406 A1 | 12/2008 | Santori et al. |
| 2009/0027778 A1 | 1/2009 | Wu et al. |
| 2009/0141242 A1 | 6/2009 | Silverstein et al. |
| 2009/0245312 A1 | 10/2009 | Kageyama et al. |
| 2009/0278960 A1 | 11/2009 | Silverbrook |
| 2009/0284713 A1 | 11/2009 | Silverstein et al. |
| 2010/0066889 A1 | 3/2010 | Ueda et al. |
| 2010/0129083 A1* | 5/2010 | Mu ................ G02B 6/4269 398/135 |
| 2010/0129946 A1 | 5/2010 | Uchida |
| 2010/0265975 A1 | 10/2010 | Baier et al. |
| 2011/0002355 A1 | 1/2011 | Jansen |
| 2011/0148328 A1 | 6/2011 | Joseph et al. |
| 2011/0164880 A1 | 7/2011 | Davidson et al. |
| 2011/0176567 A1 | 7/2011 | Joseph |
| 2012/0120976 A1 | 5/2012 | Budd et al. |
| 2012/0134681 A1 | 5/2012 | Hamana et al. |
| 2012/0169669 A1 | 7/2012 | Lee et al. |
| 2012/0232536 A1 | 9/2012 | Liu et al. |
| 2012/0281293 A1 | 11/2012 | Gronenborn et al. |
| 2013/0076960 A1 | 3/2013 | Bublitz et al. |
| 2013/0226326 A1 | 10/2013 | Yoshida et al. |
| 2013/0266326 A1 | 10/2013 | Joseph et al. |
| 2013/0278151 A1 | 10/2013 | Lear |
| 2015/0340841 A1 | 11/2015 | Joseph |
| 2016/0164261 A1 | 6/2016 | Warren |
| 2019/0268068 A1 | 8/2019 | Dacha et al. |
| 2020/0235809 A1 | 7/2020 | Joseph et al. |

FOREIGN PATENT DOCUMENTS

| | | |
|---|---|---|
| CN | 101226325 A | 7/2008 |
| CN | 101375112 A | 2/2009 |
| CN | 101854029 A | 10/2010 |
| DE | 102008030844 A1 | 12/2009 |
| EP | 1024399 A1 | 8/2000 |
| EP | 1317038 A2 | 6/2003 |
| EP | 1411653 A2 | 4/2004 |
| EP | 1345064 A3 | 12/2004 |
| EP | 1871021 A2 | 12/2007 |
| JP | H03-239374 A | 10/1991 |
| JP | 04-062801 A | 2/1992 |
| JP | 05-092618 A | 4/1993 |
| JP | H05-308327 A | 11/1993 |
| JP | 06-020051 A | 3/1994 |
| JP | H06-244502 A | 9/1994 |
| JP | 07-506220 A | 7/1995 |
| JP | H08-213954 A | 8/1996 |
| JP | H08-237204 A | 9/1996 |
| JP | H09-139963 A | 5/1997 |
| JP | H11-017615 A | 1/1999 |
| JP | 2001-246776 A | 9/2001 |
| JP | 2001-308797 A | 11/2001 |
| JP | 2001-311898 A | 11/2001 |
| JP | 2002-002015 A | 1/2002 |
| JP | 2002-026466 A | 1/2002 |
| JP | 2003-188460 A | 7/2003 |
| JP | 2003-224529 A | 8/2003 |
| JP | 2004-363756 A | 12/2004 |
| JP | 2005-102171 A | 4/2005 |
| JP | 2006-032885 A | 2/2006 |
| JP | 2006-067542 A | 3/2006 |
| JP | 2006-109268 A | 4/2006 |
| JP | 2006-148711 A | 6/2006 |
| JP | 2006-310913 A | 11/2006 |
| JP | 2008-028614 A | 2/2008 |
| JP | 2008-508730 A | 3/2008 |
| JP | 2008-118542 A | 5/2008 |
| JP | 2008-221658 A | 9/2008 |
| JP | 2008-277615 A | 11/2008 |
| JP | 2009-503611 A | 1/2009 |
| JP | 2009-049032 A | 3/2009 |
| JP | 2010-522493 A | 7/2010 |
| JP | 2010-531111 A | 9/2010 |
| JP | 2012-089564 A | 5/2012 |
| JP | 2013-502717 A | 1/2013 |
| WO | WO 1993/021673 A1 | 10/1993 |
| WO | WO 2000/016503 A1 | 3/2000 |
| WO | WO 2002/010804 A1 | 2/2002 |
| WO | WO 2003/003424 A1 | 1/2003 |
| WO | WO 2005/057267 A2 | 6/2005 |
| WO | WO 2006/015192 A1 | 2/2006 |
| WO | WO 2006/082893 A1 | 6/2008 |
| WO | WO 2008/115034 A1 | 9/2008 |
| WO | WO 2011/021140 A2 | 2/2011 |
| WO | WO 2012/106678 A1 | 8/2012 |
| WO | WO 2017/184455 A1 | 10/2017 |

OTHER PUBLICATIONS

A. Gadallah. "Investigations into Matrix-Addressable VCSEL Arrays", Annual Report 2008, Institute of Optoelectronics, Ulm University.

International Patent Application No. PCT/US2013/42767; Int'l Preliminary Report on Patentability; dated May 6, 2015; 33 pages.

Overton; High-Power VCESLs Rule IR Illumination; Laser Focus World; Aug. 2013; 2 pages.

European Patent Application No. 13882974.2; Extended Search Report; dated Oct. 5, 2016; 9 pages.

European Patent Application No. 18183404.5; Extended Search Report; dated Aug. 16, 2018; 7 pages.

Chen et al.; "Collimating diode laser beams from a large-area VCSEL-array using microlens array"; IEEE Photonics Technology Letters; vol. 11; May 1999; p. 506-508 (English Abstract).

\* cited by examiner

OPTICAL LASER DEVICE

CROSS REFERENCE TO RELATED APPLICATIONS

This application is a continuation of U.S. patent application Ser. No. 14/946,730, filed Nov. 19, 2015, which is a divisional of U.S. patent application Ser. No. 13/594,714, filed Aug. 24, 2012, which claims benefit under 35 U.S.C. § 119(e) of Provisional Application No. 61/528,119, filed Aug. 26, 2011, and of Provisional Application No. 61/671,036, filed Jul. 12, 2012, each of which are incorporated herein by reference in their entirety.

U.S. patent application Ser. No. 14/946,730 is also a continuation-in-part of U.S. patent application Ser. No. 13/077,769, filed Mar. 31, 2011, now U.S. Pat. No. 8,848,757, issued on Sep. 30, 2014, which is a continuation of U.S. patent application Ser. No. 12/707,657, filed Feb. 17, 2010, now U.S. Pat. No. 7,949,024, issued on May 24, 2011, which claims benefit under 35 U.S.C. § 119(e) of Provisional Application No. 61/153,190, filed Feb. 17, 2009.

U.S. patent application Ser. No. 14/946,730 is also a continuation-in-part of U.S. patent application Ser. No. 12/970,880, filed Dec. 16, 2010, now U.S. Pat. No. 8,613,536, issued on Dec. 24, 2013, which claims benefit under 35 U.S.C. § 119(e) of Provisional Application No. 61/288,269, filed Dec. 19, 2009, each of which are incorporated herein by reference in their entirety.

BACKGROUND

The bandwidth of transmitted data, and the range at which this data can be conveyed in open air has been dependent on technologies that involve slower single or arrayed high power semiconductor laser transmitters or combinations of such transmitters with optical modulators and/or optical amplifiers, or through the use of multiple wavelengths in combination with the previous mentioned components to achieve a high bandwidth rate for free space optical communications over distances farther than a few meters. To date the complexities involved in implementing these technologies have become extremely cost prohibitive especially for a short distance, in meters, for localized systems Available link budget or available power from the emitter is another cost consideration, as is the alignment and detection issues, which become more complicated and expensive. A cost effective wireless optical transmitter with plenty of link budget would be desirable. While vertical-cavity surface-emitting ("VCSEL") arrays can produce the optical power necessary for the distances mentioned above, and are much more cost effective, existing VCSEL arrays have not been able to produce the extremely high bandwidths (typically associated with single VCSEL devices) that are necessary.

In short distance optical communications, between adjacent transceivers and transceivers on circuit boards, using a fiber configuration limits alignment of a fiber to a laser aperture. This alignment is typically achieved through the use of mechanically assembled components that add size and cost of manufacturing, and the problem is compounded with multiple fibers. Free space optical designs based on low amounts of power in the link budget means that achievable tolerances require extreme mechanical board to board alignments which add cost with more elaborate mechanical connector designs. Again, single VCSEL devices are best suited for the bandwidth and cost structure, but lack the necessary power and limit alignment to near unachievable tolerances.

SUMMARY

The related applications illustrate how VCSEL arrays may be fabricated and tested with results that are superior to the state of the art when power and speed are considered. Due to the greater configuration flexibility in terms of design and packaging possible with VCSEL arrays, unique configurations such as arrays of sub-arrays, multiple wavelength arrays of arrays and patterned shapes can be easily realized allowing the optical path to be easily and quickly scanned without mechanical means, and shaped according to the array configuration or to have multiple possible links increasing the capabilities. The ability to produce cost effective high speed and high power arrays using these technologies creates unique opportunities for cost effective high speed optical wireless communications.

Also, high speed optical communications between adjacent circuit boards has conventionally been achieved using a fiber optic or multiple fiber transceiver or wavelength-division multiplexing of multiple channels of data into a single optical fiber configuration or a semiconductor laser free space optical transceiver configuration. In either of these configurations, it is necessary to deliver sufficient energy from the emitter to the detector to achieve minimum signal-to-noise ratio at the desired bandwidth. A successful design starts with the available power or link budget, then calculates all of the losses incurred in the system and ends with sufficient power density at the detector. High speed detectors are smaller and thereby require more power density to maintain sufficient signal to noise levels. One of the significant losses in the calculation of the link budget is alignment loss of an emitter to detector. The reliability of the system is highly dependent upon the amount of power available from the emitter to overcome the alignment issues and other system losses.

Optical communications between adjacent circuit boards offer many benefits including higher bandwidths than what is available with copper connections. A free space optical arrangement would normally be preferred over a fiber system due to the simplicity of components. However, in a free space system, accommodations must be made to account for both translational and angular misalignments between the transmitter and the receiver. In addition, laser safety consideration should be taken into account. Typically free space configurations are limited by low power devices or link budgets that require expensive or precision mechanical connectors or expensive packaging configurations. The embodiments disclosed here employ technology disclosed in the related applications, including commonly-assigned U.S. Pat. No. 7,949,024 to enable high power arrays of VCSEL devices that operate at very high bandwidths. With the added power or link budget available from these laser sources, the loose alignment tolerances enable a dramatic design change which allows small, high speed, cost effective free space simplex or duplex single or parallel channels that increase total bandwidth to levels that have previously been unachievable in a cost effective manner.

Optical communication may also provide benefits to the data center. Many of the impediments to line of sight communication, such as particulate matter in the atmosphere, are minimal in the data center environment. Greater precision in beam alignment is also achievable. Embodiments of the invention described herein are capable of leveraging these factors to achieve unprecedented bandwidth levels at reasonable cost. Furthermore, the use of optical communications drastically reduces the amount of cabling required in the data center, reducing complexity and maintenance costs.

DETAILED DESCRIPTION OF ILLUSTRATIVE EMBODIMENTS

Array Clusters

An embodiment is disclosed that includes a single, duplex, 1D or 2D array of small clusters of high power and high speed free-space laser beams (such as those described in the related applications) onto a corresponding array of detectors on the receiving side in a symmetric fashion so as to facilitate a mutual pair of inward-facing devices to provide full bi-directional communications. The clusters may be wired in parallel, or may be broken up into binary-weighted sub-groups which are driven individually and in parallel. In either case, the beams from each individual cluster may be blended using a holographic optical diffusing element which spreads the beam bundle to a collimating lens for transfer to the collection lens of each corresponding detector. This also facilitates a board-to-board "daisy chaining" scheme to enable a bus-like data architecture shared by all the boards.

Figure 1:
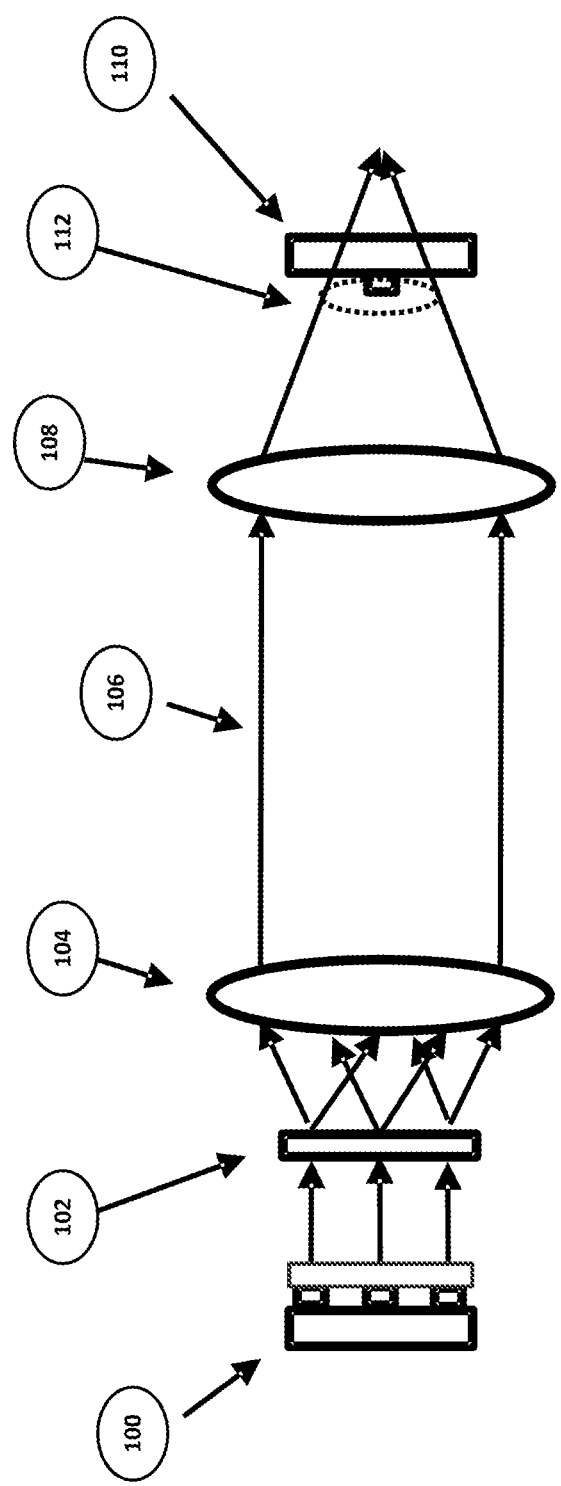
FIG. 1 depicts a single, one-channel transmitter and receiver pair.
Figure 2:
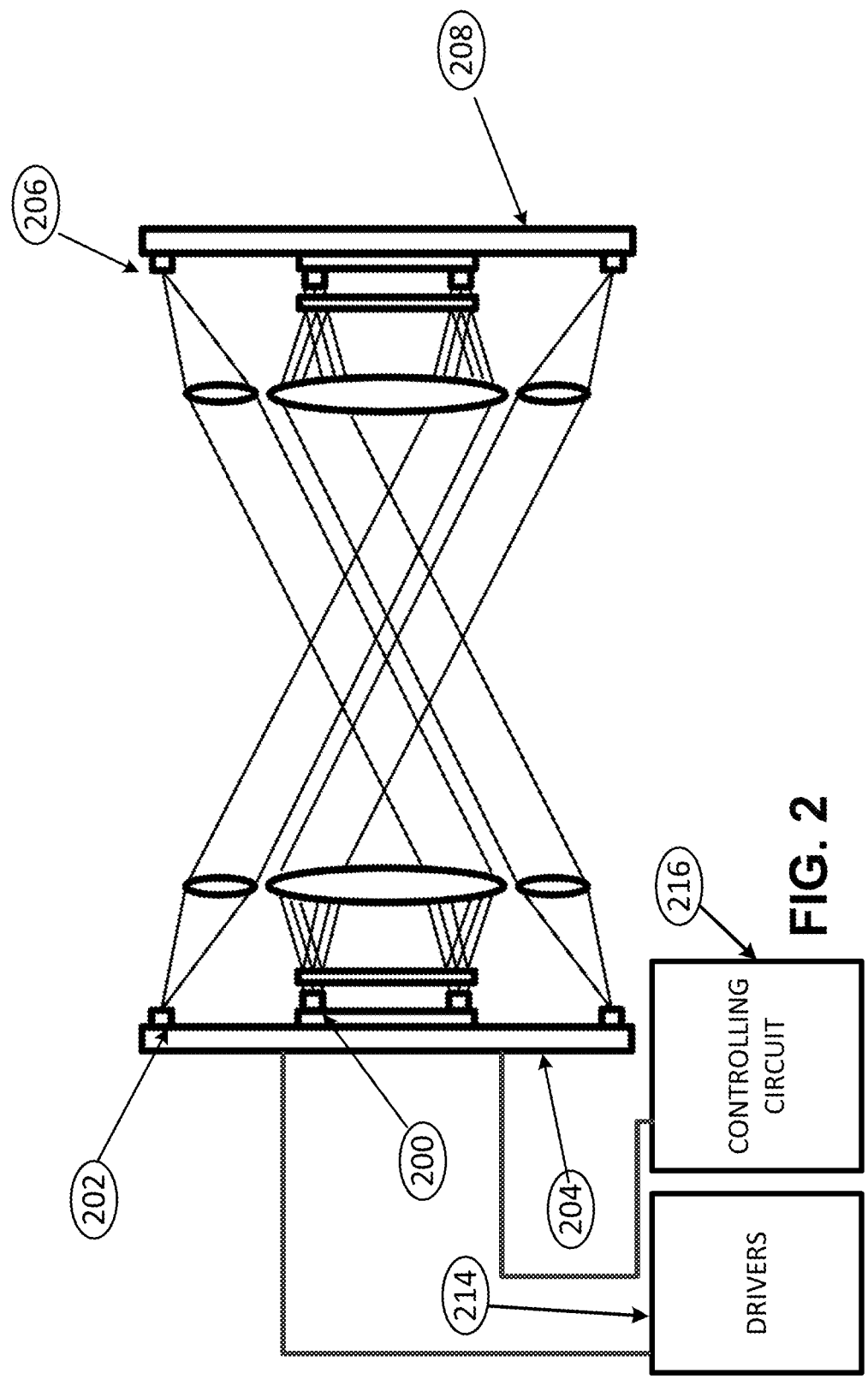
FIG. 2 depicts a pair of matching multi-channel transceivers.

FIG. 1 depicts a single, one-channel transmitter/receiver pair from the system in FIG. 2 or any similar design. The emitter may be on a chip from an epitaxial grown GaAs wafer which has been processed according to the concept set forth in U.S. Pat. No. 7,949,024, with a cluster of two or more VCSEL elements (100) may be electrically connected in parallel and driven by a single high speed driver (214). In an embodiment, the beam from each of the elements impinges upon the surface of an optical diffusing element (102) such as a holographic optical diffuser. Such a diffuser has the advantage of providing good optical power uniformity over the resulting beam spread and high transmission efficiency. The diffuse cone from each of the VCSEL elements impinges upon the back of a lens (104), whose focal length equals that of the distance from the diffusing surface to the principal plane of the lens. The beams that emerge from the lens are a combination of the beams from the individual elements, and they are not coherent, which reduces laser speckle effects. The bundle appears to the receiver as a single, semi-collimated disc of light (106). If this disc is of sufficient diameter in comparison to its optical power, then laser safety criteria may more easily be met by treating the bundle as an "extended source".

The size of this bundle at the receiver collection lens (108) may under-fill, match, or over-fill the size of the collecting lens, depending upon the amount of translational tolerance desired.

As this bundle impinges upon the receiver collection lens, it is focused to a small spot behind the surface of the detector (110) so as to form a blur circle (112) at the detector plane. This allows a certain amount of tilt or translational tolerance of the receiver to the optical axis of the transmitter while still delivering sufficient optical power at the detector plane to meet the link budget. A trade-off can thereby be made between angular tolerance and optical power to provide sufficient link budget energy within the blur circle.

FIG. 2 depicts a pair of matching multi-channel transceivers in a configuration whereby a single GaAs emitter chip (200) is situated between two or more detector/amplifier pair elements (202) on a shared substrate (204). An identical emitter array and detector/amplifier array (206) having a second shared substrate (208) is situated facing, on the optical axis, but at some distance away from the first substrate (204). A symmetric system of transmitters and receivers may thus be constructed to provide simultaneous, multi-channel communications between the two symmetric and facing substrates.

The emitter chip (200) is comprised of two or more high speed VCSEL clusters, each cluster driven by its own high speed current controlling circuit, (216). As already illustrated in FIG. 1, the transmitter lens is situated after the diffuser such that each different cluster will create its own semi-collimated beam bundle which is angularly shifted from the beam bundles from the other clusters. In this way, each bundle may be directed to its matching receiver collection lens at the periphery of the corresponding receiver substrate. The receiver lens at the periphery of the substrate is offset towards the center of the substrate to accommodate the fact that the transmitter beam is arriving from near the center of the corresponding substrate, and not parallel to the optical axis between the substrates. The scheme may be extended to two dimensions whereby the emitter chip is a 2D array of m×n clusters, and the detector/amplifier array is a ring of elements surrounding the emitter chip.

Figure 3:
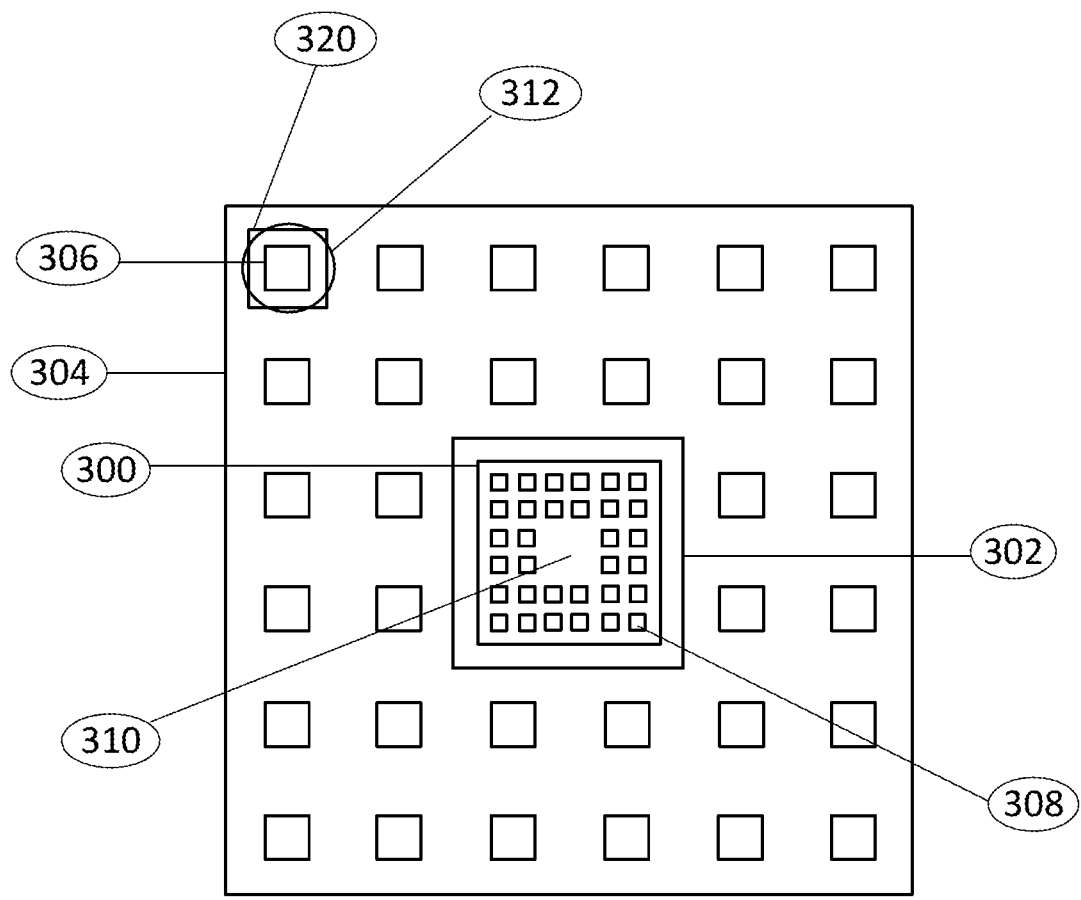
FIG. 3 depicts a 32-bit emitter chip comprising both emitters and detectors.

FIG. 3 represents a top view of one of the matching pairs which have a 32 bit configuration. This drawing illustrates the density possible with a transceiver which has 32 clustered emitter sources arrayed on a chip (300) in a pattern that would look like a square donut with the clusters formed around the square area in the middle (310). Many other configurations could be used as described herein. The illustrated design of an embodiment allows a dense, but small emitter chip. The emitter chip would be located in the square area (310), while allowing many detectors and support chips (306) to be located around the perimeter of the structure. The support chips, like transverse impedance amplifiers, could be arrayed on one chip and routed to the detectors in a number of ways that are known to those familiar with the art of chip layouts and integrating hybrid chip layouts. They could also be connected through via holes in the substrate. Passive or active chip cooling techniques could also be used with this configuration.

FIG. 3 illustrates an embodiment of one transceiver of a matching pair, where an array of parallel driven clustered elements grouped in a configuration (300) that can be easily transferred optically onto a corresponding detector array (304) using the laser source technology, such as that described in U.S. Pat. No. 7,949,024. The individual clusters of elements are themselves arrays of single elements (308), each cluster driven with their own source provide a powerful laser source which overcomes the design problem of link budget and related tolerances by an abundance of power allowing a large "blur" spot (312) to be imaged across a detector's position allowing a loose alignment tolerance from board to board. This may enhance plug and play architectures for optical communication between circuit boards.

Intensity Modulation

Binary weighted arrays from technology described in commonly assigned US patent Publication No. 2011/0148328 A1, formed within each of the clusters (308) of FIG. 3 may be used to encode additional data into each channel by using digital intensity modulation (Amplitude Shift Keying) for any reasonable number of sub-clusters that could be fit into one cluster and imaged onto the detector. Thus, binary data may be encoded by associating intensity levels with bit positions in the binary data. In one embodiment, the least significant bit ("LSB") is associated with the lowest intensity level. The number of bits that can effectively be encoded is therefore primarily dependent upon the receiving end having an LSB signal greater than the minimum link budget and the accuracy of the level discrimination circuitry. The diffuser element mentioned above is ideal for distributing the different power levels of each emitter sub-cluster evenly over the detector blur spot.

VCSELs which have higher frequency responses or become faster as their current bias increases, until approaching power rollover, may enhance intensity modulation. VCSELs prefer to be turned fully on for higher speed capability. Normally, intensity modulation is achieved by using an analog signal level to achieve a different intensity level from the laser and thus lower levels would slow down the entire data transmission system. Turning on different arrays to their highest bias (so as to reduce distortion) and allowing the selected groupings to be used to change the intensity levels, allows very high bandwidths to be achieved using intensity modulation.

Figure 4:
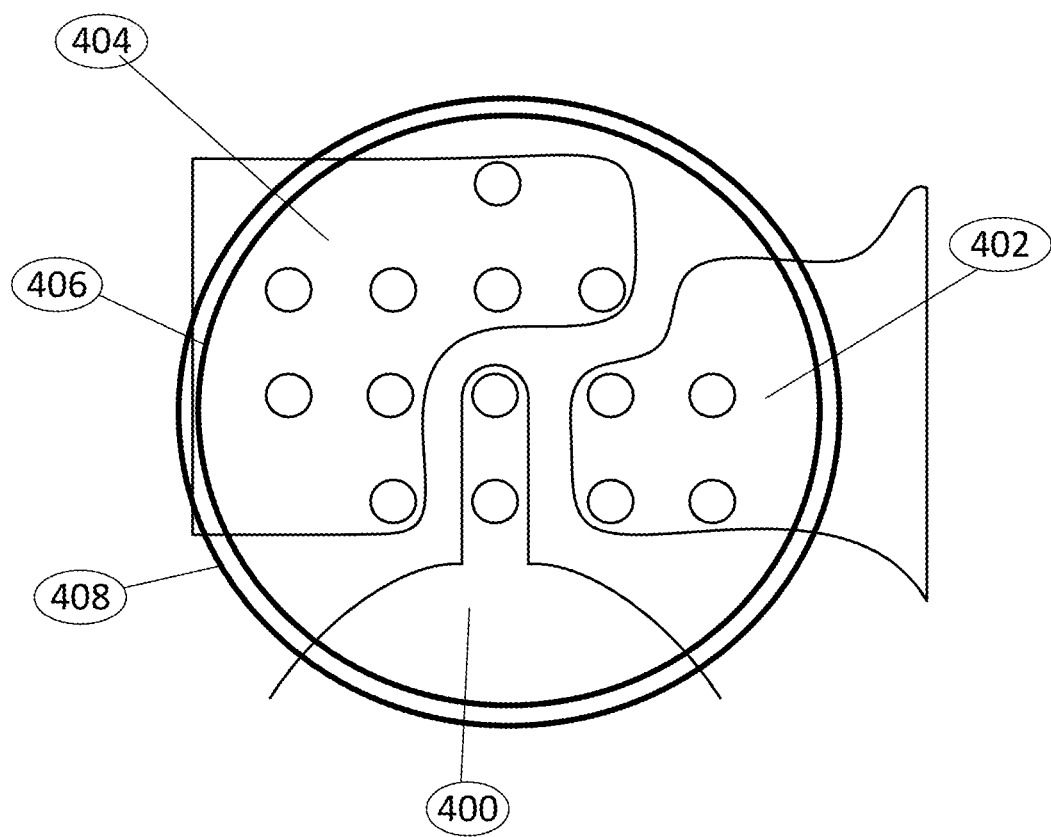
FIG. 4 depicts an arrangement of sub-clusters useful for intensity modulation.

FIG. 4 illustrates an individual cluster grouping that has been divided into three separate binary weighted sub-clusters. The laser output of each sub-cluster increases, in a binary fashion, by either doubling the output of a single element or by adjusting the number of elements to increase the power of the sub-cluster in a binary fashion. Each sub-cluster is controlled by its own driver source which is independent from the other sub-clusters and their drivers. In this manner any combination of bits (sub-clusters) can be controlled and thereby encoded during each clock pulse. Turning on different sub-clusters or combinations thereof during the same pulse timing would represent increased intensity levels which could be identified by a level discrimination circuit as different encoding levels. In this case group (400) has 2 VCSEL emitters, group (402) has 4 VCSEL emitters and group (404) has 8 VCSEL emitters. It is assumed that each of the emitters in this example has close to the same power output as its neighbors. Holographic optical element (406) distributes the hotspots to a more intensity uniform mixed beam and lens (408) semi-collimates the output of whichever groups of arrays are turned on in a single pulse.

As the varying groups are turned on the following data information can be directed through beam intensity levels provided the detector has the dynamic range to detect differences between the least significant bit (LSB) level and the intensity level of the most significant bit (MSB):

000—No groups on during clock pulse
001—only group (400) is turned on during clock pulse
010—only group (402) is turned on during clock pulse
011—group (400) and (402) are turned on during same clock pulse
100—only group (404) is turned on during clock pulse
101—group (400) and (404) are turned on during same clock pulse
110—group (402) and (404) are turned on during same clock pulse
111—group (400), (402) and (404) are turned on during same clock pulse These configurations allow eight separate data codes to be relayed with one pulse. The preferred embodiment could use this intensity modulation technology but it is not necessary. Intensity modulation may also be achieved, for example, without defining groups or by having a one-to-one relationship between groups and emitters.

An additional embodiment would employ wavelength-division multiplexing or dense wavelength-division multiplexing, with each particular wavelength having bit string information encoded on each of the respective pulses for that wavelength, or other optical multiplexing schemes, such as orthogonal frequency division multiplexing, where a number of closely spaced orthogonal sub-carrier signals are used to carry data. A device of this nature is capable of an extremely high data transfer rate. Furthermore, frequency doubling is not required in this embodiment. Frequency adding may be employed to achieve longer, eye-safe wavelengths, which is an important factor when high powered laser propagation is employed.

In another embodiment, any number of wavelengths or beams produced by any number of light sources and/or emitter chips may be combined by one or more optical elements to form a highly resolved data pulse. Such a device is capable of potentially unlimited bit information capacity, subject only to the size, focal length, and distance of the combining lens and the number of subgroups that can be defined according to the limits of the dynamic range of detection.

Beam Steering

In an embodiment, an array or cluster of photonic elements behind a lens, such that beams emitted from the photonic elements strike the lens at varying positions, providing directivity. Beam steering may be achieved by selectively activating an element of the array. This allows for non-mechanical optical alignment, thus reducing or eliminating excessive gimbal movement, saving energy and increasing reliability. Beam scanning may also be achieved through use of this technique. Both one-dimensional and two-dimensional directivity may be achieved by the use of one-dimensional or two-dimensional arrays, respectively. In addition, 360° coverage may be achieved by employing multiple sectors, e.g. a hexagonal, spherical, or other three-dimensional arrangement of outward-facing arrays.

Optical Switching in a Data Center Environment

Figure 5:
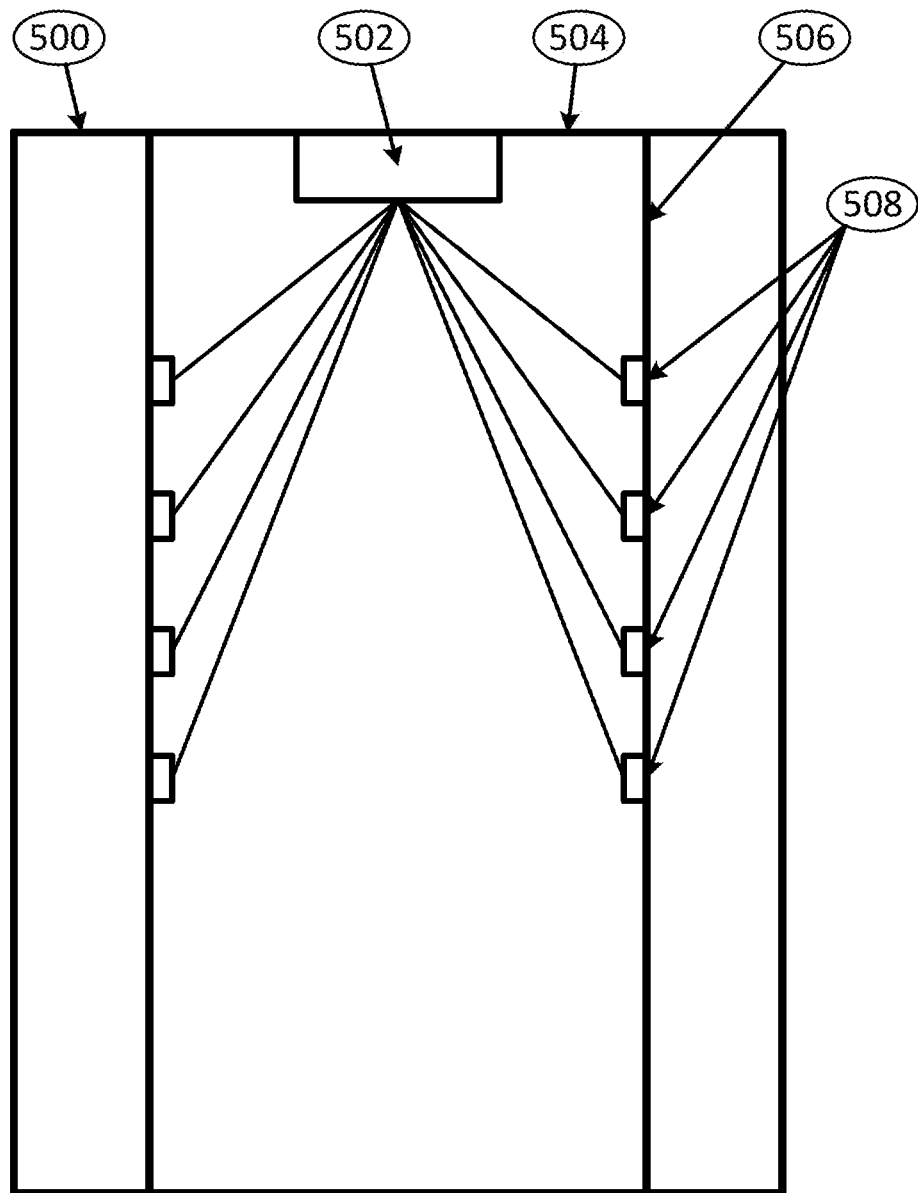
FIG. 5 depicts a free space optical switch in a data center rack.

Additional embodiments allow for optical switching applications that employ an array of photonic elements behind a lens. Narrow beams may be preferred in this embodiment. In a data center rack, an optical switch employing this technique may be placed such that narrows beams emitted from the switch may reach defined positions within the rack. For example, the switch may employ a multiple lens array and be placed at the top of the rack, as seen in FIG. 5. In one embodiment, equipment rack (500) may contain in its interior optical switch (502) mounted to surface (504), which may be the ceiling of the rack. Detectors (508) may be mounted to surface (506), which may be interior to the rack or a wall of the rack. Optical switch (502) and detectors (508) are placed such that optical communications between the switch and the detectors are not disturbed, for example by maintaining line of sight between the optical switch (502) and the detectors (508). This arrangement allows for precise data shower beams to reach server connections at defined positions within the rack, enabling a cable free rack. While a ceiling arrangement is illustrated in FIG. 5, the optical switch (502) could be mounted on the floor of the rack or anywhere in-between the floor and the ceiling, depending on the configuration of the rack and what portion of the rack provided the clearest line of sight for the beams.

Figure 6:
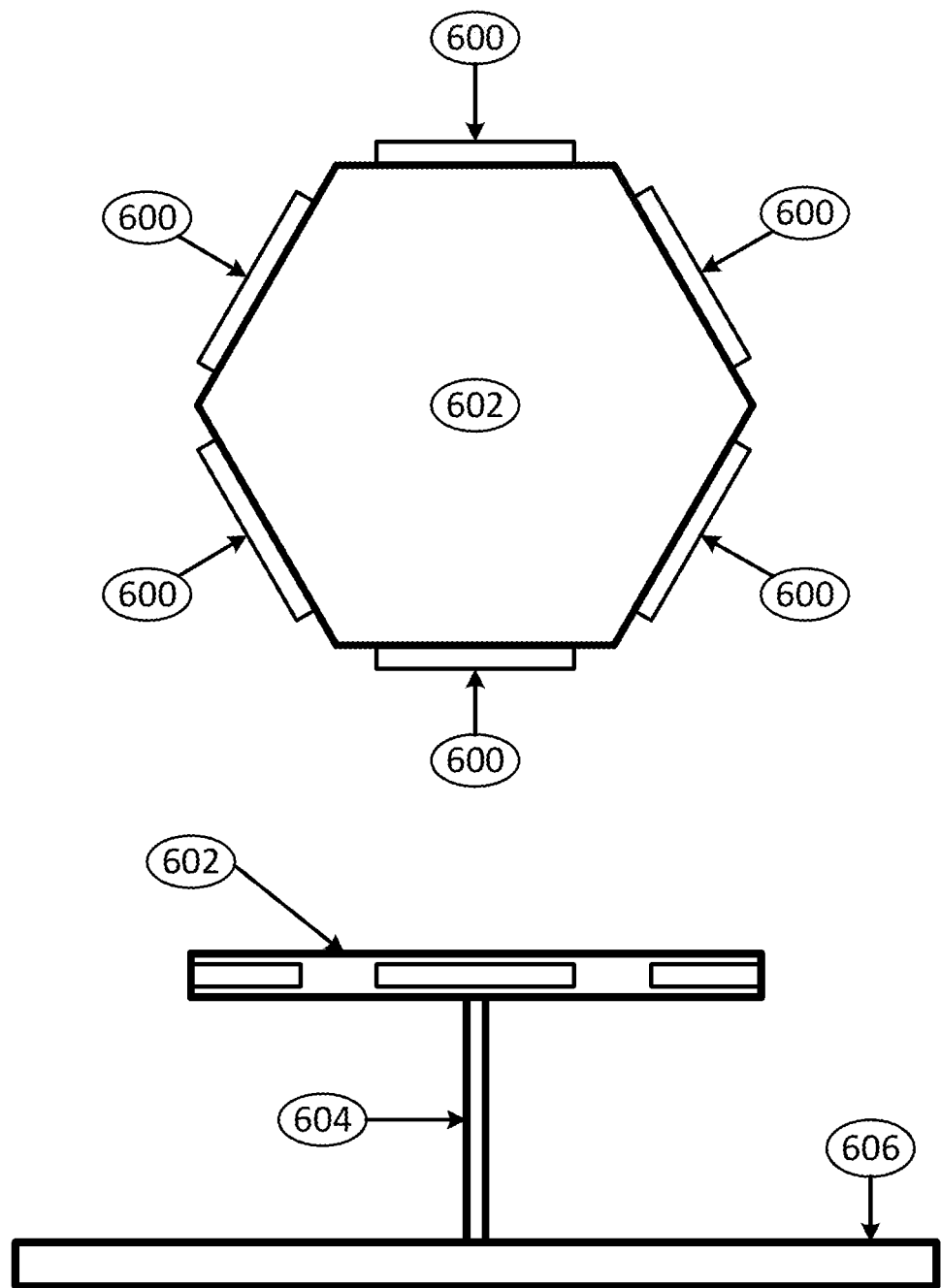
FIG. 6 depicts a structure for mounting a free space optical switch or transceiver above a surface.

Other embodiments allow for various network topologies, employing a wide variety of link geometries such as start, daisy chain, ring, or mesh. Various factors such as the arrangement of racks, airflow, and electrical cabling may create impediments to line of sight, but these impediments may be overcome by selecting suitable link geometry. The appropriate geometry may involve not only the network topology, but also correct positioning in both the horizontal and vertical dimensions. For example, the device pictured in FIG. 6 may be employed to position the photonic array a suitable distance above a rack. Optical switches or transceivers (600) may be mounted to a multi-sided structure (602), which is shown having six sides, but could be configured to have many different configurations with many different numbers of side. The mounting system may support alignment or reorientation of the optical switches or transceivers (600). For example, as shown in the lower portion of FIG. 6, the multi-sided structure (602), shown from a side perspective, may be connected to rack (606) by support structure (604), which may allow for rotation or height adjustment. Further the optical switch (600) may be formed from arrays of sub-arrays with a lens positioned in front of the groupings of sub-arrays in order to steer a beam emitting from switch (600) to a specific position where the detection might be located. This may allow another degree of freedom and allow automatic alignment of beams. Theses subgroups of arrays in combination with the correct lens design may cover a small area in which automated beam alignment may take place by a scanning and receiving scheme.

Use of embodiments within the data center allow for improved link budget. More precise alignment of the beams allows for a narrower field of view and relaxed power requirements, which in turn allows for higher bandwidth. When used within the data center, embodiments are capable of achieving at least gigabit/second throughput on the free space optical communication network.

On a macro scale, not all frequencies propagate well in the atmosphere. Suspended particulate matter, such as fog, dust, rain, or snow, may also impeded light-wave propagation. However, in a data center most frequencies propagate well enough and particulate matter is not usually an issue.

Figure 7:
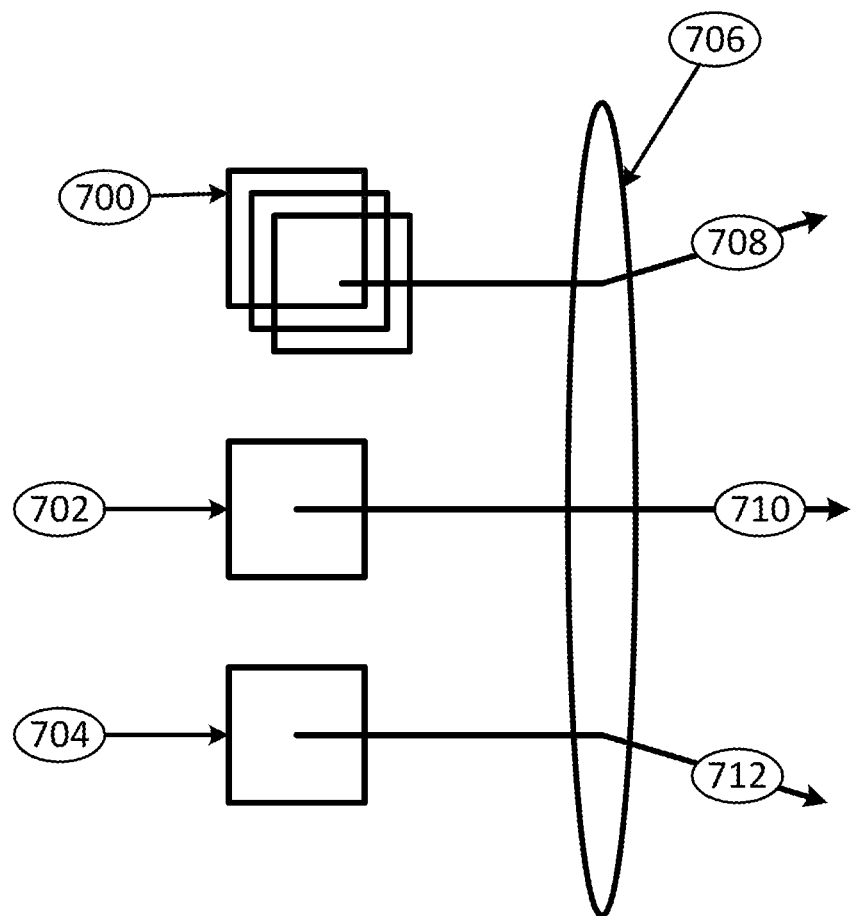
FIG. 7 depicts an embodiment employing frequency, angular, and spatial multiplexing.

High aggregate bandwidth, 40 Gb/s or higher, may be achieved through multiplexing. Wavelength-division multiplexing allows for multiple light wavelengths to be placed on the same optical path. Where the source configuration is overlaid, greater power density results. The source configuration may also be tiled, allowing for angular separation. An embodiment may employ frequency multiplexing or spatial and angular multiplexing with a single wavelength, as depicted in FIG. 7. For example, stacked emitter (700) may emit laser output at multiple frequencies, striking the surface of lens (706) and following optical path (708). Non-stacked emitters (702) and (704) may emit frequencies of the same or different wavelengths, and their output strikes lens (706) and follows optical paths (710) and (712), respectively. The beam size determines both spatial channel density and angular resolution.

High Speed High Power Arrays for Optical Switching

Arrays of VCSEL devices may be used in a high speed switching matrix. Information may be fed to the switch by a single source such as a 100 Gb/s fiber connection. Each packet of information that needs to be routed is separated by a standard routing chip that routes packets to the appropriate output channel.

The signal from the output channel may be amplified by a high speed current driver which is connected to a single VCSEL device, or an array of VCSEL devices. Each of these, in turn, is part of a larger array, the size of which defines how many channels are available in the overall switching network.

The output of the laser devices are separated by a controlled distance that is imaged through an optical element onto a pattern of optical elements, such as lenses, arrays of lenses, or optical fibers. The signal of each sub-element is then injected into that single optical or fiber channel. Additional optical elements that could be deployed within the path of a laser beam for a variety of purposes include diffusers, mirrors, and MEMS devices, to name a few.

The optical or fiber channels also form an array. The output of this array may be handled in at least two ways. First, it may be directed onto an array of detectors, with each detector signal being converted back into an optical signal and injected into a fiber. The fiber may go to an optical plug such as a single fiber plug, or any other type of optical termination. Second, the output of the optical switching array may be injected directly into an optical element or fiber.

In order to end up with a detectable signal, the link budget of the configuration must be analyzed. In many cases there is insufficient power at the start of the system. Extra power will enhance the signal quality and improve the bit error rate. It may therefore be desirable to operate each sub-element at as high a power level as practical.

Figure 8:
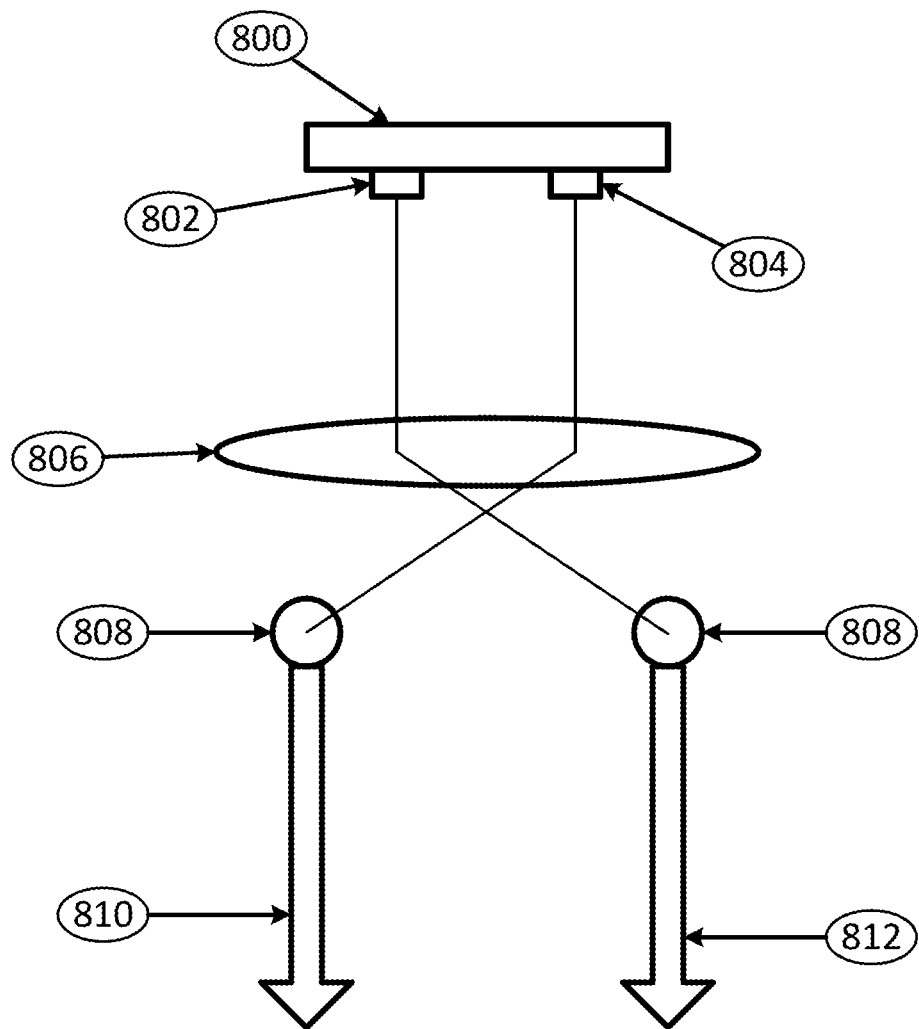
FIG. 8 depicts an embodiment of a high speed free space optical switch.

An embodiment is depicted in FIG. 8. A number of VCSEL arrays (802), (804) may be mounted to a surface (800). Output from the VCSEL array (802) passes through lens (806), striking ball lens (808), which may be coupled to a channel (812), which may be an optical fiber. Likewise, output from the VCSEL array (804) passes through lens (806), striking ball lens (808), which may be coupled to a different channel (810). The lines depicted in FIG. 8 representing the output do not represent ray tracing, but rather only a positional imaging relationship.

Eye Safe Optical Networks for Home and Office

Numerous applications may make use of the herein disclosed form of free space optical communications. For example, using a transmitter to spread power density over a large area in which the power density is eye safe, one or more emitters/receivers may be embedded in a table top, with a light signal coming up to a counter or surface with a protective clear cover so that mobile devices which have an emitter/receiver on or embedded in the device, may be placed on top of a table and automatically linked to a 1G to 10G data source. Numerous other physical configurations are possible involving emitters/receivers being placed in other locations in or around a surface in the room for the same purpose. For example, a laser emitter cluster may emit a laser beam to an optical element shaped as a clear planar surface having a first side and a second side, where the first side receives the laser beam and spread an output of the laser beam over an area of the second side sufficient to reduce a power density of the laser beam to an eye safe level.

Embodiments ease this type of operation because no aligning is necessary due to the wide signal coverage area. In addition, there are no hardwired connections to get lost, mangled or stolen. Public access networks of this type are much easier without cables. Transmitters could use THUNDERBOLT technology from INTEL or other protocols. These transmitters need more power for larger area of transmission.

Free-space optical communications over a distance greater than a meter requires a limited optical power density for eye safe operation, in combination with wider area coverage for ease of reception positioning. These requirements have limited the devices capable of offering the high-power and high-speed required for a wider field of use.

With the sufficient bandwidth and power density enabled by the high-powered, high-speed device offering a wide field of use for the optical signal, a single link may transmit data over multiple channels or may serve many users simultaneously. An array of sub-grouped arrays behind a lens may be switched so that separate beams can be positioned relative to separate areas. Detectors arrays, also called Free-Space Optical MIMO (Multiple Input-Multiple Output) detectors, may be sequenced to identify where signals need to be sent and send signals to those specific areas. Multiple sub-grouped arrays may be functional in any one time sequence, which allows simultaneous communication links to multiple users. Another embodiment for multiple users may employ wavelength division multiplexing by the same MIMO detectors scheme as described above, but with filtered inputs sensitive to multiple wavelengths, and the ability to sense and respond using multiple channels at different wavelengths for both input and output.

One or more transmitters may be connected to a data source such as a fiber optic cable, a high speed Ethernet cable, or a video source.

A transmitter may consist of a signal input interface, the packaged VCSEL array, VCSEL driver, and control and amplification electronics, and may also include receiver components and electronics making a transceiver and appropriate beam-shaping optics, all in a common housing. Other components may include an optical component for spreading the optical power density to eye safe levels and a lens for controlling beam diameter and dispersion of the beam in the free space area.

The transmitter and receiver housing may be pointed towards each other using a simple plastic molded eyeball type socket scheme. The transmitter or transceiver may be pointed toward the receiver or transceiver by an adjustable gooseneck lamp type configuration. The transmitter and receiver may each operate from a simple low voltage DC power supply or even batteries. The transmitter/transceiver may be installed in conjunction with other ceiling-resident utilities such as lighting, safety/security sensors, video cameras and security claxons.

The VCSEL array may be operated as a group (ganged), or as an addressable array where one or more sub-arrays, each of one or more elements, may be independently signal-driven and moved across the total array positionally.

The transmitter may operate in "broadcast" mode delivering a wide beam of data to one or more receivers.

The transmitter may operate in "beaming" mode delivering a narrow beam to one or more receivers.

The transmitter may operate in "panning" mode where sub-arrays are operated in sequence across the VCSEL array which translates into an angular motion in free-space.

The system may be configured as a simplex (one-directional) link, or as a full duplex (bi-directional) link. In the latter case, there is a VCSEL array and one or more detectors at each end of the optical link.

When detector arrays are used, the detector array or sub-array having the strongest signal may be selected as indicating the nearest transmitter for preferential attention, for "hand-off" to a neighboring transmitter, or to accommodate moderate angular misalignments of the receiving optics away from the desired transmitter.

Transmitters may be placed in a ceiling of an office, with each one spaced at a distance such that they have sufficient coverage at the receiver without excessive overlap of signal.

Transmitters may be placed centrally on a vertical support, such as a light pole, with each transmitter covering its own angular sector of space.

The receiver may consist of a light collecting device, a detector, amplifying electronics and a suitable output interface.

The light collecting device may be an imaging lens or a non-imaging device such as a cylindrical parabolic concentrator.

At the receiving detector, the data may be conveyed to a local data transport scheme such as fiber optic, Ethernet, digital video cable or even wireless such as Wi-Fi.

The receiver may also be incorporated directly into a digital switch or router which distributes the ultra-high bandwidth to multiple local users over cable or wireless.

The receiver may be integrated directly to the component needing the high bandwidth link.

Because of the likely asymmetry of the bandwidth required for the downlink versus the uplink, alternative cable or wireless uplinks may be used such as Wi-Fi, BPL, Ethernet, etc.

An optical filter for the transmitter wavelength may be used at the receiving end to suppress all other wavelengths other than that of the transmitter needed. Multiple wavelength links in a single transmitter may be used.

Polarized VCSEL arrays may be used in conjunction with polarized filters on the receivers to help eliminate stray reflection signal interference.

Optical limiting path blinders at the receiver may eliminate stray reflective signals coming in at different angles other than the incident signal.

Multiple transmitters or transceivers may be used from different locations allowing an triangulational positioning grid for best signal reception or to prevent signal blackout from moving objects.

Window filters may be used for securing data from leaving building. Transmitters or transceivers may be mounted on walls, floors, ceilings or objects. Transmitters or transceivers may be mounted in attics crawl spaces or hard to access point to point areas. Transmitters or transceivers may be mounted in pipes. Transmitters or transceivers may be mounted in chimneys.

Additional Embodiments

Numerous additional embodiments are possible. For example, each matching pair of a transceiver anywhere from one to thousands of pairs may use this technology in any number of layout configurations.

Clusters of elements may be driven as a single channel or configured for intensity modulation of each transceiver channel.

A bottom emitting array is disclosed in U.S. Pat. No. 7,949,024. However, a bottom emitting array in a flip-chip configuration or a top emitting array or grouping of top emitting arrays may be used for the multi-element emitter devices.

A single duplex transceiver may be used for board to board free space optical communications using arrayed VCSEL technology mentioned in U.S. Pat. No. 7,949,024.

A 2D pattern of almost any shape may be formed instead of merely a square or rectangular pattern which might function better using round optical elements.

A 1D array with any number of clusters or emitters could be used in a configuration other than single or 2D.

Any number of patterns could be used to form the clusters and to image onto the same pattern of arrays.

The 1D or 2D arrays could be used as a backplane to select which channel will receive the data pulse by selecting a different emitter or emitters to transfer the data to those select channels. When data needs to be sent to a specific channel the appropriate emitter would be chosen which is already in alignment to that channel through the imaging or projecting lens in front of the whole array. Embodiments could also be used at longer distances for high speed data communications applications with the appropriate imaging optics Emitter arrays mentioned above in FIG. 3 (300) could be formed from the same high speed and high power technology or, as noted above, flip chipped to a substrate instead of designed onto the substrate.

Flipped chipped emitters could be at a different wavelengths allowing WDM capability for emitters and appropriate filtering of wavelengths for detectors.

High power beams could be spread over a larger receiving area or overlapping with other emitter beams onto an area that may have multiple detectors. Filters covering the detectors could be used in conjunction with multiple wavelength emitter chips to separate the signals of those overlapping beams from different wavelength emitter clusters.

Transmitters or transceivers may be used for high speed long haul applications.

Transmitters or transceivers may be used between satellites.

Transmitters or transceivers may be mounted on telephone poles or rooftops of buildings.

Transmitters or transceivers may be mounted on vertical poles for better transmission angles.

The receiver portion of a transceiver may have a photovoltaic 320 or "solar cell" situated around the detector, as illustrated in FIG. 3, in order to recover all optical power possible, or at least excess laser energy, when the bundle of laser beams is configured to over-fill the collection lenses and detectors in an area so to achieve easier alignments.

The photovoltaic device mentioned above may be a source of power which is transmitted optically from a base station or device in order to transmit power and/or data communications.

In one embodiment, linear arrays with any number of rows may be employed for data transmission. Any number or all of the rows may be simultaneously on, even if the pulses have the same or similar wavelength. The output position of each row, in relation to the other rows, adds a dimensional element to wavelength-division multiplexing or dense wavelength division multiplexing.

In another embodiment, a one-dimensional array is used as to produce a single wavelength pulse, which is combined with other sources of the same or different wavelengths. The combined wavelength's output pulse intensity is scanned in a vertical and horizontal manner, enabling data transmission.

In another embodiment, the speed and data rate of VCSEL arrays can be increased by employing flip chip technology and a design for high-speed arrays with a waveguide being formed around each sub-array or element, as described in U.S. Pat. No. 7,949,024.

What is claimed:

1. An optical laser, comprising:
   at least one transceiver system, comprising:
   one or more clusters of laser emitters,
      wherein a cluster of laser emitters, of the one or more clusters of laser emitters, comprises a plurality of sub-clusters of laser emitters,
         wherein each sub-cluster, of the plurality of sub-clusters, is configured to emit one or more laser beams, and
         wherein the plurality of sub-clusters comprise a plurality of binary weighted sub-clusters;
   a plurality of drivers,
      wherein each sub-cluster, of the plurality of sub-clusters, is controlled by a corresponding driver of the plurality of drivers, and
      wherein the corresponding driver is independent of other sub-clusters of the plurality of sub-clusters;
   an optical diffusing element configured to receive the one or more laser beams and output a diffuse cone for each of the one or more laser beams;
   one or more collimating lenses configured to combine the diffuse cone into a bundle of laser beams; and
   one or more clusters of laser detectors configured to receive the bundle of laser beams,
      wherein each cluster of laser detectors, of the one or more clusters of laser detectors, is configured to be optically coupled with a corresponding cluster of laser emitters, of the one or more clusters of laser emitters, by the one or more collimating lenses.

2. The optical laser of claim 1, wherein the bundle of laser beams is configured to over-fill or under-fill one or more collection lenses based on an amount of translational tolerance.

3. The optical laser of claim 2, further comprising:
   a photovoltaic device configured to surround each laser detector, of the one or more clusters of laser detectors, to collect excess laser energy when the bundle of laser beams is configured to over-fill the one or more collection lenses.

4. The optical laser of claim 1, wherein the bundle of laser beams is a combination of the one or more laser beams, and wherein the one or more laser beams in the combination are not coherent.

5. The optical laser of claim 1, wherein the at least one transceiver system further comprises:
   one or more collection lenses configured to receive and focus the bundle of laser beams into a focused bundle of laser beams at a focal point behind a surface of the one or more clusters of laser detectors so that the focused bundle of laser beams forms a blur circle at the surface of the one or more clusters of laser detectors.

6. The optical laser of claim 5, wherein the focal point is based on a translational tolerance and an optical power of the focused bundle of laser beams.

7. The optical laser of claim 1, wherein each cluster of laser emitters, of the one or more clusters of laser emitters, include two or more vertical-cavity surface emitting laser (VCSEL) elements configured to be electrically connected in parallel and driven by a corresponding driver of the plurality of drivers.

8. The optical laser of claim 1, wherein:
the one or more clusters of laser emitters are centrally located on a surface and are driven by an independent controlling circuit; and
the one or more clusters of laser detectors are co-located distally to the one or more clusters of laser emitters.

9. The optical laser of claim 8, wherein the one or more clusters of laser emitters are arranged in a linear array.

10. The optical laser of claim 8, wherein the one or more clusters of laser emitters are arranged in a two-dimensional array and the one or more clusters of laser detectors form a perimeter around a plurality of laser emitters.

11. The optical laser of claim 5, wherein the one or more collection lenses are configured to blur the focused bundle of laser beams based on an alignment tolerance.

12. The optical laser of claim 1, further comprising:
a second transceiver system, wherein the at least one transceiver system is symmetric with the second transceiver system.

13. The optical laser of claim 1, wherein a laser output of each sub-cluster, of the plurality of sub-clusters, increases in a binary fashion.

14. The optical laser of claim 1, wherein a laser output of a particular sub-cluster, of the plurality of sub-clusters, is increased in a binary fashion by increasing an output of a laser emitter of the particular sub-cluster.

15. The optical laser of claim 1, wherein a laser output of a particular sub-cluster, of the plurality of sub-clusters, is increased in a binary fashion by adjusting a quantity of laser emitters in the particular sub-cluster.

16. The optical laser of claim 1, wherein a first sub-cluster, of the plurality of sub-clusters, comprises two vertical-cavity surface emitting laser (VCSEL) emitters;
wherein a second sub-cluster, of the plurality of sub-clusters, comprises four VCSEL emitters; and
wherein a third sub-cluster, of the plurality of sub-clusters, comprises eight VCSEL emitters.

17. The optical laser of claim 16, wherein each VCSEL emitter, of the plurality of sub-clusters, has a same power output.

18. The optical laser of claim 16, wherein a particular lens, of the one or more collimating lenses, is configured to semi-collimate an output of at least one of the first sub-cluster, the second sub-cluster, or the third sub-cluster.

19. The optical laser of claim 1, wherein the at least one transceiver system further comprises:
a holographic optical element configured to distribute hotspots to an intensity uniform mixed beam.

20. The optical laser of claim 1, wherein a first sub-cluster, of the plurality of sub-clusters, comprises a different quantity of vertical-cavity surface emitting laser (VCSEL) emitters than a second sub-cluster of the plurality of sub-clusters.

* * * * *